United States Patent [19]

Jin et al.

[11] Patent Number: 5,665,252

[45] Date of Patent: Sep. 9, 1997

[54] METHOD OF SHAPING A POLYCRYSTALLINE DIAMOND BODY

[75] Inventors: Sungho Jin, Millington; Wei Zhu, North Plainfield, both of N.J.

[73] Assignee: Lucent Technologies Inc., Murray Hill, N.J.

[21] Appl. No.: 501,632

[22] Filed: Jul. 12, 1995

[51] Int. Cl.$^6$ .......................... B29D 11/00; B29D 25/00
[52] U.S. Cl. ................... 216/33; 216/53; 216/96
[58] Field of Search ...................... 216/33, 52, 53, 216/96

[56] References Cited

U.S. PATENT DOCUMENTS

| | | | |
|---|---|---|---|
| 5,328,550 | 7/1994 | Graebner et al. | 156/628 |
| 5,382,314 | 1/1995 | Jin | 156/628 |
| 5,458,827 | 10/1995 | Holly | 264/400 |
| 5,486,263 | 1/1996 | Dautremont-Smith et al. | 216/33 |

OTHER PUBLICATIONS

"Diamonds Polished by Solid State Diffusion," by W. van Enckevort, *Physics World*, Aug. 1992, pp. 22–23.

"Thinning and Patterning of CVD Diamond Films by Diffusional Reaction," by S. Jin et al., *Diamond and Related Materials*, vol. 2 (1993), pp. 1038–1042.

"Massive Thinning of Diamond Films by a Diffusion Process," by S. Jin et al., *Applied Physics Letters*, vol. 60(16), Apr. 20, 1992, pp. 1948–1950.

"Shaping of Diamond Films by Etching with Molten Rare-Earth Metals," by S. Jin., *Nature*, vol. 362, Apr. 29, 1993, pp. 822–824.

*Primary Examiner*—Thi Dang
*Attorney, Agent, or Firm*—Eugen E. Pacher

[57] ABSTRACT

The method of shaping a polycrystalline diamond (PCD) body (exemplarily a wafer of CVD-PCD) utilizes our discovery that the rate and amount of diamond removal from a given region of a PCD body depends, for a given metal "etchant" at a given temperature, on the thickness of the etchant layer overlying the given region, with relatively larger etchant thickness being associated with relatively higher removal rate and amount. Exemplarily, the method can be used to substantially remove thickness variations and/or film curvature from as-produced PCD films. An exemplary metal that can be used in the practice of the invention is mischmetal. The metal etchant can be molten, partially molten or solid.

12 Claims, 4 Drawing Sheets

METHOD OF SHAPING A POLYCRYSTALLINE DIAMOND BODY

FIELD OF THE INVENTION

This invention pertains to shaping of polycrystalline diamond (PCD) bodies by a process that involves contacting the PCD body with, typically, molten metal.

BACKGROUND OF THE INVENTION

PCD bodies, typically films prepared by chemical vapor deposition, are of use as, e.g., heat spreaders, optical components and cutting tools. For many potential applications, however, it will be necessary to be able to appropriately shape an as-produced PCD film.

As is well known to those skilled in the art, PCD has properties that differ substantially from those of conventional (single crystal) diamond. For instance, shaping of a PCD body by polishing typically is impractically slow and inefficient. Indeed, until recently, no convenient and efficient method of removing a significant amount of material from a PCD body was known. See, for instance, W. van Enckevort, *Physics World*, August 1992, pp. 22.

Recently, some practical methods of removing diamond material from a PCD body were discovered. Common to all these methods is a step of maintaining the relevant surface of a PCD body in intimate contact with a hot (solid, molten or partially molten) metal "etchant". See, for instance, S. Jin et al., *Diamond and Related Materials*, Vol. 2, (1993), p. 1038; S. Jin et al., *Applied Physics Letters*, Vol. 60 (16), April 1992, p. 1948; S. Jin et al., Nature, Vol. 362, Apr. 29, 1993, p. 822. See also U.S. Pat. No. 5,328,550, which discloses use of a molten rare earth metal alloy etchant, and U.S. Pat. No. 5,382,314 ('314), which discloses a method of selective diamond removal from a PCD body that involves the use of "etch-retarding" material appropriately interposed between the PCD surface and the (optionally molten) metal "etchant". Co-assigned U.S. patent application Ser. No. 08/368,581, filed Jan. 4, 1995 by J. E. Graebner et al., now U.S. Pat. No. 5,500,157 discloses a method of shaping a PCD body by contacting the surface of the body with an appropriately shaped solid template. The above referenced publications, patents and application are incorporated herein by reference.

Although the method of the '314 patent makes it possible to selectively remove diamond material from a PCD body, the method typically requires one or more thin film deposition steps (typically involving a vacuum deposition process) with delicate thickness control of the etch-retarding material. In view of the commercial importance of shaping PCD bodies, it would be desirable to have available a shaping method that does not require thin film deposition with close thickness control. This application discloses such a method that is, inter alia, adapted for selectively removing material from as-produced PCD film such that, commonly observed, thickness variations and/or film curvature are substantially removed.

The drawings are not to scale, and features are not necessarily shown in proportion.

THE INVENTION

Embodiments of the invention utilize our unexpected discovery that the rate and amount of diamond removal from a given region of a PCD body depends, for a given metal or alloy (collectively "metal") "etchant" at a given temperature, on the thickness of the etchant layer overlying the given region, with relatively larger thickness being associated with relatively higher removal rate and amount.

Figure 1:
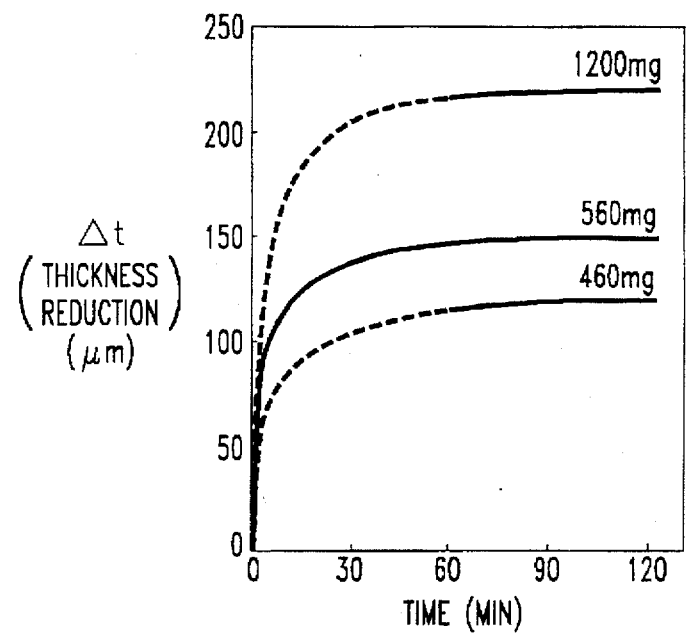
FIG. 1 shows data on diamond removal from PCD bodies as a function of time, for three different quantities of metal etchant.

FIG. 1 illustrates the above discussed unexpected feature. Onto three 1 cm×0.5 cm×500 µm platelets of CVD-produced PCD were placed, respectively, 460, 560 and 1200 mg of solid mischmetal (a commercially available mixture of rare earth elements including Ce and La). A Mo buffer plate was placed on the mischmetal, followed by an alumina plate and a 30 g weight. The assemblies were then heated to 900° C. in Ar, resulting in melting of the mischmetal, and spreading of the molten mischmetal over the respective PCD surfaces. The resulting diamond removal as a function of time is shown in FIG. 1. For instance, after 2 h at 900° C., the respective PCD film thicknesses were reduced by 120 µm, 150 µm and 220 µm. Additional processing time did not significantly increase the amount of removed diamond. This clearly establishes the dependence of diamond removal on the thickness of the etchant.

The invention exemplarily is embodied in a method of making an article that comprises a PCD body, exemplarily a PCD wafer or potion of a wafer. The method comprises providing a starting PCD body having a major surface, and transforming the starting PCD body into a processed PCD body by a process that comprises removing a predetermined quantity of diamond material from the major surface of the starting PCD body. The amount (thickness) of diamond that is to be removed from the major surface depends on location on the major surface, with the amount to be removed at a first location being larger than the amount to be removed at a second location. The removal of the predetermined quantity of diamond material involves contacting the major surface with a quantity of etchant metal at a processing temperature.

Significantly, the process is carried out such that at the processing temperature the quantity of etchant metal has non-constant thickness, with a greater thickness of the etchant metal overlying the first location on the major surface than overlying the second location thereon, whereby more diamond material will be removed from the first location than will be removed from the second location. The process still further comprises maintaining the quantity of etchant metal at the processing temperature in intimate contact with the major surface until the predetermined quantity of diamond material is removed, i.e., until the starting PCD body is transformed into the processed PCD body.

In particular embodiments the removal process comprises providing a shaped mandrel having a non-planar surface that faces the starting PCD body, with the quantity of etchant metal disposed between the non-planar surface of the mandrel and the starting PCD body. At the processing temperature the quantity of etchant metal not only is in intimate contact with the major surface of the PCD body but also essentially conforms to the non-planar surface of the mandrel.

In a further embodiment the quantity of etchant metal is shaped such that a greater thickness of the etchant metal overlies the first location than overlies the second location, with a shaped buffer body provided to maintain the quantity of etchant metal in the desired shape at the processing temperature. Means for communicating an applied force to the buffer body are contemplated. These and other embodiments will be described in more detail below.

The above-described unexpected property of etchants is considered to be particularly useful for industrial processing of PCD bodies since it provides an inherent upper limit for the amount of diamond removal at a given location on the body, thereby preventing over-etching and ruining of relatively expensive PCD bodies. For instance, the instant method can be advantageously used to appropriately shape CVD-produced PCD films. As is known to those skilled in the art, such films frequently have curvature and/or non-constant thickness upon completion of formation. This is a significant shortcoming, and means to correct it are needed. The method according to the invention can be used to correct the shortcoming (i.e., can be used to reduce or remove the curvature and/or thickness variations), and such correction is a currently preferred use of the method.

Figure 2:
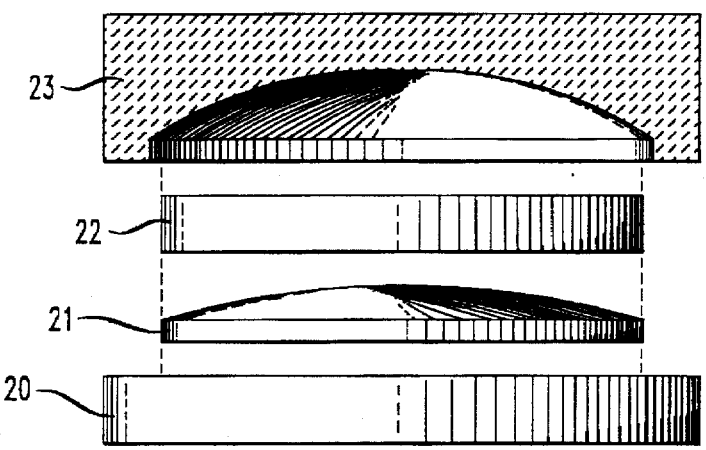
FIGS. 2 and 3, 4 and 5, 6, 7 and 8, respectively, schematically depict exemplary embodiments of the invention.

FIG. 2 schematically shows the elements of an exemplary embodiment of the invention, wherein numerals 20–23 refer, respectively, to a support, an as-produced (non-uniform thickness) PCD wafer, an appropriate quantity of solid etchant metal (e.g., mischmetal), and an appropriately shaped mandrel, provided to impose and maintain the desired non-uniform thickness on the etchant throughout the etching step.

Figure 3:
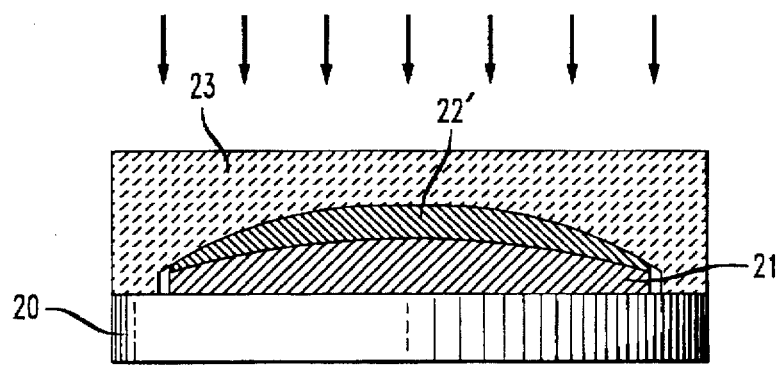

FIG. 3 schematically depicts the assembly of FIG. 2 after heating to the processing temperature, exemplarily above the melting temperature of the etchant metal, and application of sufficient force to achieve intimate contact with the PCD surface and conformation to the mandrel surface. As can be seen from FIG. 3, molten etchant 22 essentially fills the space between PCD wafer 21 and template 23, with the space desirably shaped such that, after maintaining the assembly as shown for a predetermined time at a predetermined temperature, more material is removed from the interior portions of the wafer than from the peripheral portion thereof such that the processed wafer is of substantially uniform thickness. In this and other figures, arrows are used to indicate application of force that urges the mandrel towards the support.

After completion of the etching step, the assembly typically is allowed to cool. Reacted (and possibly remaining unreacted) etchant is removed by conventional chemical etching. If desired, conventional polishing can be used to further smooth the etched surface.

Figure 4:
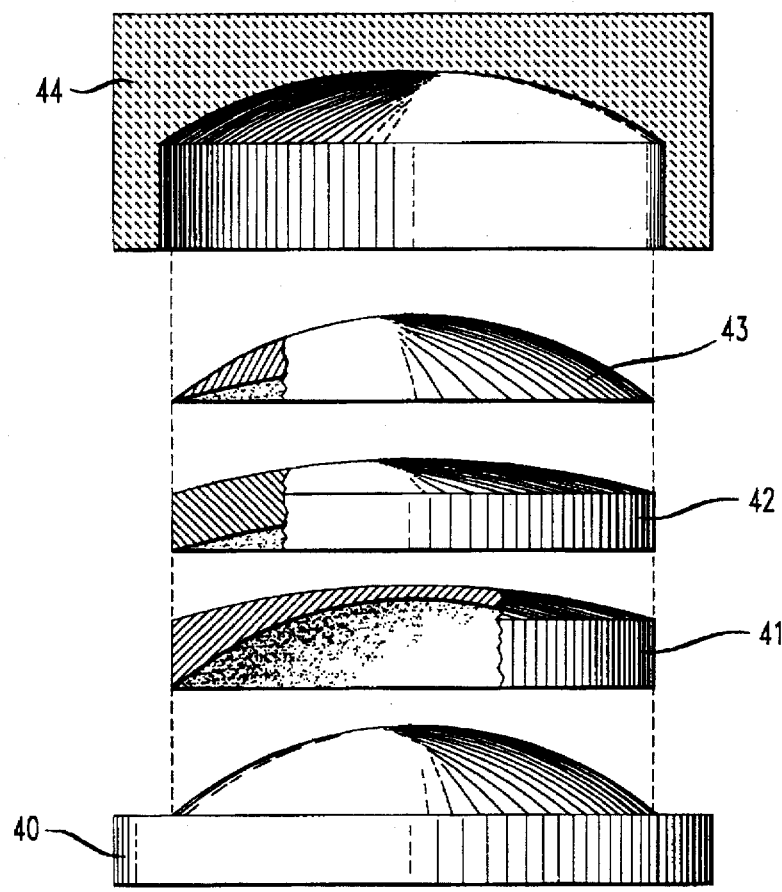

FIG. 4 shows an assembly that can be used to reduce or remove the curvature of an as-produced PCD wafer, with numerals 40–44 referring, respectively, to the shaped lower mandrel, preshaped lower etchant body, PCD wafer, preshaped upper etchant body, and shaped upper mandrel. Preshaping of the etchant bodies is optional.

Figure 5:
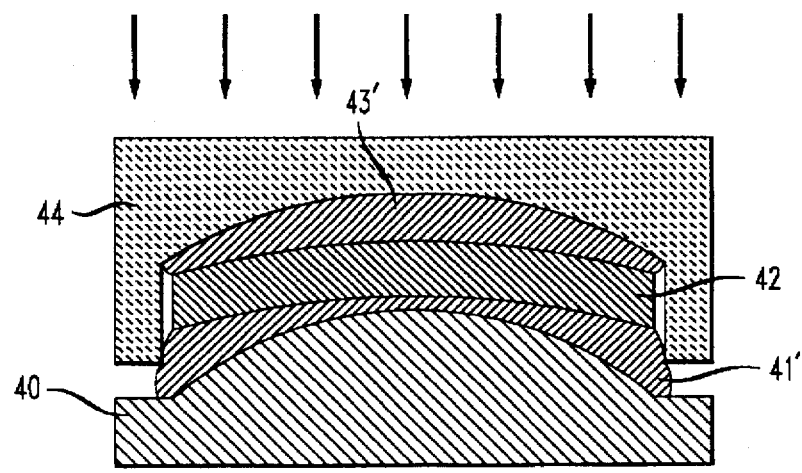

FIG. 5 schematically shows the assembly of FIG. 4 after heating to the processing temperature. Numerals 41' and 43' refer to the (exemplarily molten) lower and upper etchant. Application of a force to urge upper mandrel 44 towards lower mandrel 40 is optional, and in some cases the weight of mandrel 44 may be sufficient to correctly position the mandrel.

The etchant body (e.g., 22 of FIG. 2; 41 and 43 of FIG. 4) need not be a unitary body but could, for instance, be a stack of foils or even be compacted powder.

An aspect of embodiments of the invention is the provision of an appropriately shaped body to create (and/or preserve) the desired thickness variation in the etchant. In order to achieve the desired non-uniform material removal from the PCD body the etchant has to essentially conform to the shape of that body, and to be in intimate contact with the PCD surface. "Intimate contact" exists if the etchant is in contact with the PCD surface over substantially all of the interface, not just at some isolated points, as those skilled in the art will appreciate.

Conformation to the mandrel or other body, and intimate contact with the PCD surface, are readily attained if the etchant metal is above its melting temperature (e.g., above about 800° C. for Ce, above about 900° C. for mischmetal, above about 500° C. for La—12% Ni alloy). Although use of molten etchant is currently preferred, conformation and intimate contact can also be achieved by, e.g., heating the etchant such that it is partially molten or just below the melting point (e.g., within 50° C. of the melting point), such that the etchant can be plastically deformed by a (relatively small) applied force, or by using powder or granular-shaped etchant. Less force is typically needed if a pre-shaped etchant metal body is provided.

The optimal value of applied force will typically depend on the specifics of a particular embodiment (e.g., nature of the etchant metal, processing temperature, size of the PCD surface that is to be etched), and cannot be specified herein. However, it will be a trivial matter for one skilled in the art to experimentally determine an acceptable value of force in any given embodiment.

A currently preferred metal etchant is mischmetal. However, a variety of other metal etchants are also contemplated. These include the previously disclosed etchants such as elemental rare earth metals (Y and elements of atomic number 57–71) and the binary or higher order alloys of rare earth and non-rare earth metals, e.g., La—Ni, Ce—Co, Y—Cu—Ni, etc.

Mandrels useful in the practice of the invention typically are made of material that is substantially non-reactive with the etchant at the processing temperature, exemplarily a ceramic such as Ce-oxide, Y-oxide, La-oxide, $Al_2O_3$, $ZrO_2$ or MgO, a carbide or nitride, or a refractory metal such as Mo, Ta, or W. For example, if the etchant is Ce, La or mischmetal, the use of Ce-oxide or La-oxide is preferred since it typically minimizes or eliminates the possibility of undesirable chemical reactions.

The processing temperature will typically be in the range 400°–1000° C., preferably above the melting point of the metal. For instance, if the etchant metal is an alloy containing rare earth and non-rare earth metal (e.g., La—Ni, Ce—Co), the processing temperature is typically in the range 400°–900° C., as these alloys typically have a relatively low melting point. Typical processing times are in the range 0.1–10 hrs. The preferred atmosphere during high temperature processing is an inert one (e.g., Ar, He), but the use of other atmospheres (e.g., $N_2$, air, $H_2$ or mixtures thereof) is not excluded.

Figure 6:
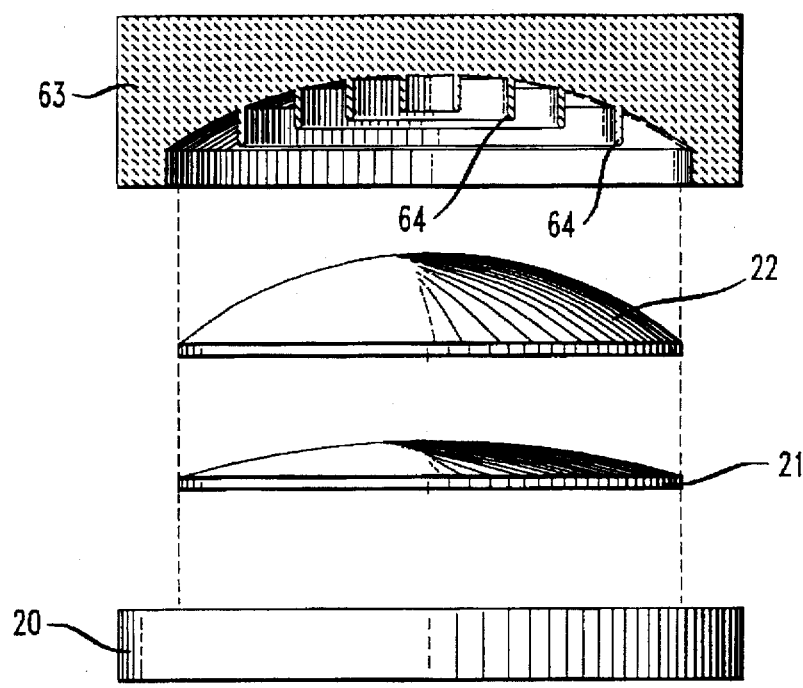

In some cases it may be desirable to reduce or eliminate lateral carbon transport (through diffusion or convection) in the metal etchant during processing. Those skilled in the art will recognize that such lateral transport may undesirably reduce the thickness-dependence of the novel shaping process. In some embodiments of the invention such reduction is achieved by provision of transport barriers, as schematically indicated in FIG. 6, wherein numerals 20–22 refer to the same features as in FIG. 2, and numeral 63 refers to a mandrel with a multiplicity of transport barriers 64. The transport barriers can be integral with the mandrel, or can be removable (e.g., Mo foils inserted into slots in the mandrel). Typically the barriers will form concentric rings, with spacing between adjacent rings exemplarily in the range 2–10 mm. Alternatively, compartment-like (sub-divided cell type) barriers may be used. The height of the barriers advantageously is selected such that during processing the barriers extend close to the surface of the PCD body, substantially without contacting the surface.

Figure 7:
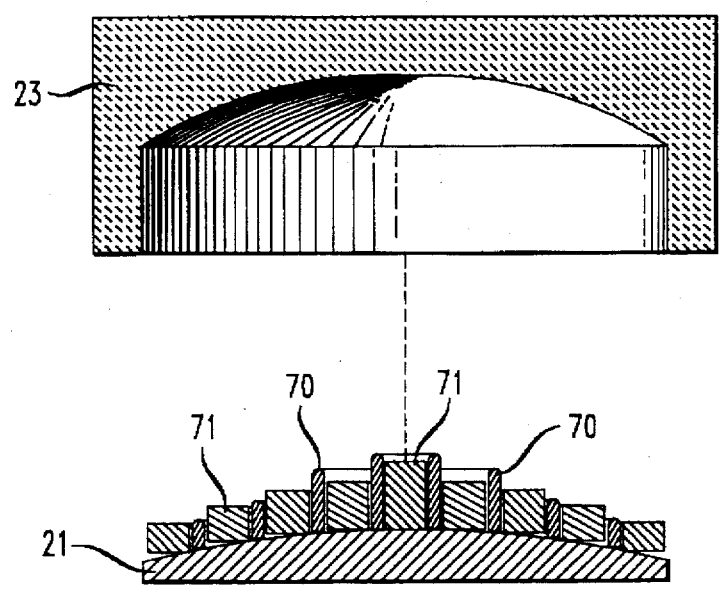

FIG. 7 schematically shows a further variant of the transport barrier approach wherein numerals 70 and 71 refer, respectively, to a multiplicity of concentric transport barriers of predetermined height, and to predetermined quantities of (solid) metal etchant. In a still further variant (not shown), the metal etchant bodies are replaced by appropriate quantities of metal powder or granules. This can, at least in some cases, result in even easier placement of the etchant, because the process of shaping and/or cutting of the etchant material can be omitted.

Figure 8:
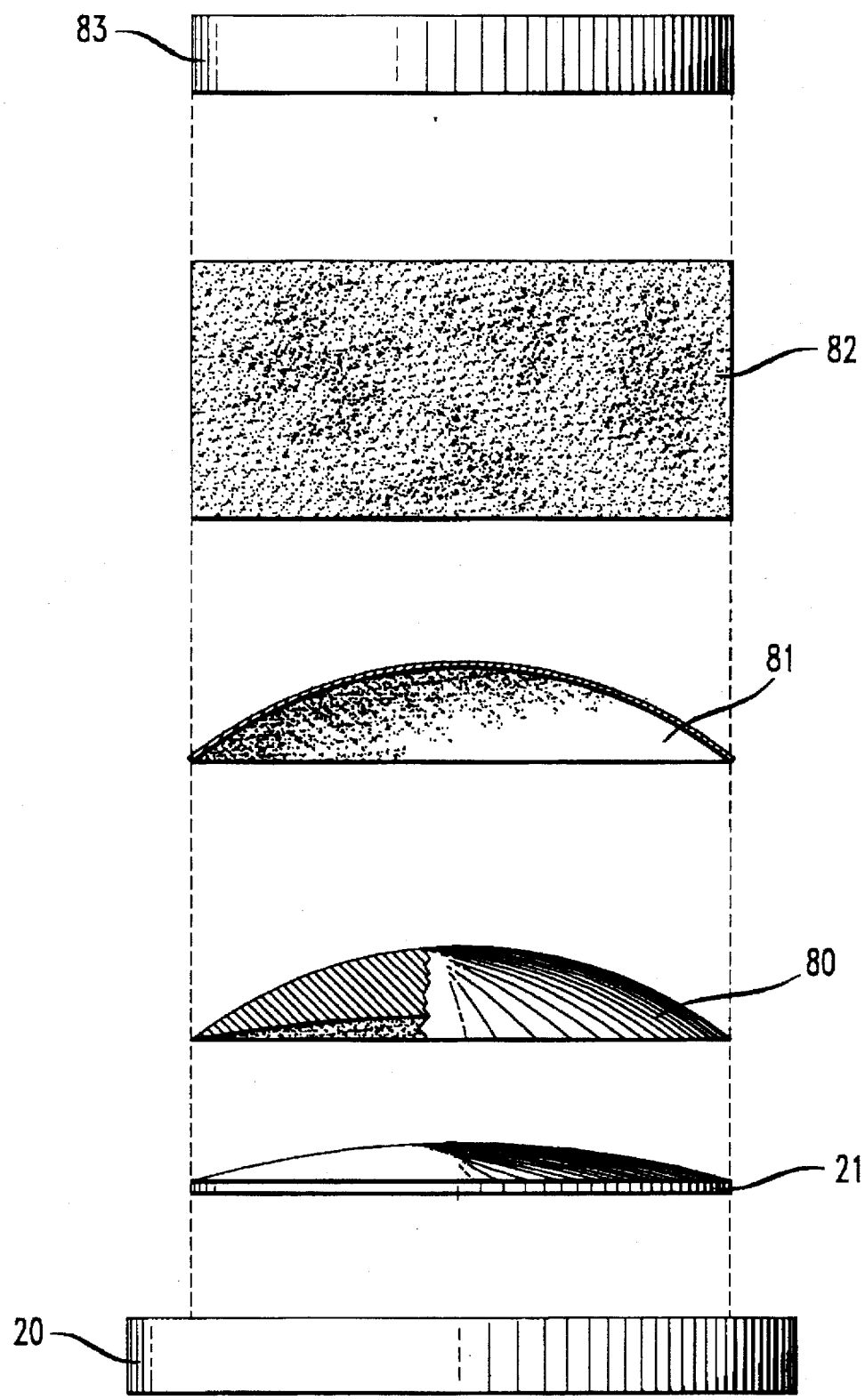

FIG. 8 schematically depicts a further embodiment of the invention, wherein an appropriately shaped body of etchant metal is provided, with shaped buffer body 81 provided to confine the etchant metal. Numeral 82 refers to a pressure distributing medium (e.g., compressible mesh screen, or a powder aggregate), and 83 to a dead weight or other means for applying force to the assembly.

Shaping of PCD according to the invention will typically require knowledge of the relationship between etchant thickness and diamond removal for the selected metal etchant, processing temperature and time, in order to be able to provide a properly shaped mandrel and/or pre-shaped etchant body. The relationship cannot be specified in advance, since it generally depends on several variables, including the etchant metal composition, temperature and time. However, those skilled in the art will, by means of a minor amount of routine experimentation, be readily able to establish the relationship for any desired set of processing parameters. For instance, the relationship can be established substantially in the manner used to obtain the data for FIG. 1.

The above-described method has utility not only for flattening diamond wafers but for producing any desired geometry (e.g., lense shape). Furthermore, the method has utility not only for shaping CVD PCD bodies but is expected to be applicable also to other materials such as nitrides (including carbon-nitride-based materials).

EXAMPLE 1

A polycrystalline CVD diamond wafer has 4 inch (about 10 cm) diameter, with thickness 670 µm, 610 µm and 520 µm at, respectively, the center, halfway between center and perimeter, and the perimeter. A 4 inch diameter disk of mischmetal (23 wt. % Ce, 53 wt. % La, 16 wt. % Nd, 4 wt. % Pr) is prepared, with the disk having a thickness 1.61 mm, 0.98 mm, and 0.12 mm at, respectively, the center, halfway between center and perimeter, and the perimeter. The bottom surface of the mischmetal disk has a curvature that is substantially the same as that of the top surface of the PCD wafer. A ceramic cylinder, with inner diameter slightly larger than the diameter of the PCD wafer, is provided. A 4 inch diameter alumina disk is placed into the bore of the ceramic cylinder, followed by the PCD wafer, the mischmetal disk, and a buffer body (Mo foil, 0.002 inch [about 0.05 mm] thick, formed into a curved geometry substantially conforming to the top surface of the mischmetal disk). A pressure-transmitting powder ($Al_2O_3$) is then placed onto the buffer body and gently packed. Finally, a 4 inch diameter, 500 g weight is placed on top of the powder, still within the bore of the ceramic cylinder.

The assembly is then placed into a furnace with a metal chamber, the chamber is evacuated and back-filled with Ar, heated to 700° C. in 1 h, held at that temperature for 0.5 h, heated to 900° C. in 0.5 h, and held for 2 hours. After allowing the assembly to cool to room temperature the processed PCD wafer is removed from the ceramic cylinder, and etched in 50% nitric acid to remove reacted and unreacted mischmetal as well as the Mo foil. The processed PCD wafer has significantly reduced thickness variation, its thickness being 528 µm, 505 µm and 513 µm at, respectively, the center, halfway between the center and the perimeter, and the perimeter.

The invention claimed is:

1. Method of making an article that comprises a processed polycrystalline diamond body, the method comprising
   a) providing a starting polycrystalline diamond body having a major surface, and transforming the starting body into the processed body by a process that comprises
   b) removing a quantity of diamond material from the major surface of the starting body, with the amount of diamond to be removed at a first location on the major surface being greater than the amount to be removed at a second location, the quantity of diamond material to be removed by a process that comprises contacting the major surface with a quantity of etchant metal such that the etchant metal is in intimate contact with the major surface; wherein
   c) the major surface is contacted such that, at a processing temperature, the quantity of etchant metal has a non-constant thickness, with a greater thickness overlying the first location than is overlying the second location; and wherein
   the quantity of etchant metal is maintained in intimate contact with the major surface until the quantity of diamond material is removed from the major surface.

2. Method of claim 1, comprising selecting the processing temperature such that the quantity of etchant metal is molten during at least a portion of step c).

3. Method of claim 1, comprising providing a shaped mandrel having a non-planar surface that faces the starting body, with the quantity of etchant metal disposed between said non-planar surface of the mandrel and the starting body, with said non-planar surface selected such that at the processing temperature the quantity of etchant metal has said non-constant thickness.

4. Method of claim 1, wherein said quantity of etchant metal comprises a body of etchant metal that is shaped to have non-constant thickness.

5. Method of claim 1, comprising providing lateral transport barriers selected to at least reduce lateral carbon transport in the quantity of etchant metal during step c).

6. Method of claim 1, comprising providing a further quantity of etchant metal, said further quantity disposed to contact a second major surface of the starting polycrystalline diamond body.

7. Method of claim 6, wherein said further quantity of etchant metal comprises a further body of etchant metal that is shaped to have non-constant thickness.

8. Method of claim 1, comprising urging said quantity of etchant metal towards the major surface during at least a part of step c.

9. Method of claim 8, comprising providing a shaped buffer member in contact with the quantity of etchant metal, and a deformable pressure distributing medium in contact with said shaped buffer member, said urging comprising application of a force to the pressure distributing medium.

10. Method of claim 1, wherein the quantity of etchant metal comprises one or more members of the group consisting of the rare earth metals.

11. Method of claim 10, wherein the quantity of etchant metal consists substantially of mischmetal.

12. Method of claim 1, wherein at a temperature below the processing temperature said quantity of etchant metal comprises metal powder, metal granules, or metal foils.

* * * * *